(12) United States Patent
Yin et al.

(10) Patent No.: US 11,199,444 B2
(45) Date of Patent: Dec. 14, 2021

(54) TIME-TO-DIGITAL CONVERTER CIRCUIT AND METHOD FOR SINGLE-PHOTON AVALANCHE DIODE BASED DEPTH SENSING

(71) Applicant: Taiwan Semiconductor Manufacturing Company Limited, Hsinchu (TW)

(72) Inventors: Chin Yin, Hsinchu (TW); Chih-Lin Lee, Hsinchu (TW); Shang-Fu Yeh, Hsinchu (TW); Kuo-Yu Chou, Hsinchu (TW); Calvin Yi-Ping Chao, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 202 days.

(21) Appl. No.: 16/454,358

(22) Filed: Jun. 27, 2019

(65) Prior Publication Data
US 2020/0018642 A1    Jan. 16, 2020

Related U.S. Application Data

(60) Provisional application No. 62/696,389, filed on Jul. 11, 2018.

(51) Int. Cl.
*G01J 1/44* (2006.01)
*G01B 11/22* (2006.01)
(Continued)

(52) U.S. Cl.
CPC ............ *G01J 1/44* (2013.01); *G01B 11/22* (2013.01); *G04F 10/005* (2013.01);
(Continued)

(58) Field of Classification Search
CPC ............ G01J 1/44; G01J 2001/4413; G01J 2001/442; G01J 2001/444;
(Continued)

(56) References Cited

U.S. PATENT DOCUMENTS

2013/0300838 A1* 11/2013 Borowski ............ G01S 7/4865
                                                                 348/46
2015/0041625 A1* 2/2015 Dutton .................... G01S 17/10
                                                                 250/208.1
(Continued)

*Primary Examiner* — John R Lee
(74) *Attorney, Agent, or Firm* — Jones Day

(57) ABSTRACT

A self-calibration time-to-digital converter (TDC) integrated circuit for single-photon avalanche diode (SPAD) based depth sensing is disclosed. The circuit includes a SPAD matrix with a plurality of SPAD pixels arranged in m rows and n columns, the SPAD pixels in each column of SPAD pixels are connected by a column bus; a global DLL unit with n buffers and n clock signals; and an image signal processing unit for receiving image signals from the column TDC array. The circuit can also include a row control unit configured to enable one SPAD pixel in each row for a transmitting signal; a circular n-way multiplexer for circularly multiplexing n clock signals in the global DLL unit; a column TDC array with n TDCs, each TDC further comprises a counter and a latch, the latch of each TDC is connected to the circular n-way multiplexer for circular multiplexing.

23 Claims, 16 Drawing Sheets

(51) Int. Cl.
 *G04F 10/00* (2006.01)
 *H03L 7/081* (2006.01)
(52) U.S. Cl.
 CPC ...... *H03L 7/0812* (2013.01); *G01J 2001/444* (2013.01); *G01J 2001/4466* (2013.01)
(58) Field of Classification Search
 CPC ......... G01J 2001/4446; G01J 2001/446; G01J 2001/4466; G01J 2001/448; G01B 11/22; G04F 10/005; H03L 7/0812; H03L 7/081; H03L 7/08; H03L 7/06; H03L 7/0814; H03L 7/0816; H03L 7/0818
 See application file for complete search history.

(56) References Cited

U.S. PATENT DOCUMENTS

| | | | |
|---|---|---|---|
| 2019/0165792 A1* | 5/2019 | Huh | H03L 7/0816 |
| 2019/0257950 A1* | 8/2019 | Patanwala | G01S 17/894 |
| 2019/0259902 A1* | 8/2019 | Shimizu | G01S 17/10 |
| 2020/0018642 A1* | 1/2020 | Yin | G01B 11/22 |
| 2020/0408885 A1* | 12/2020 | Yin | G01S 7/4865 |

* cited by examiner

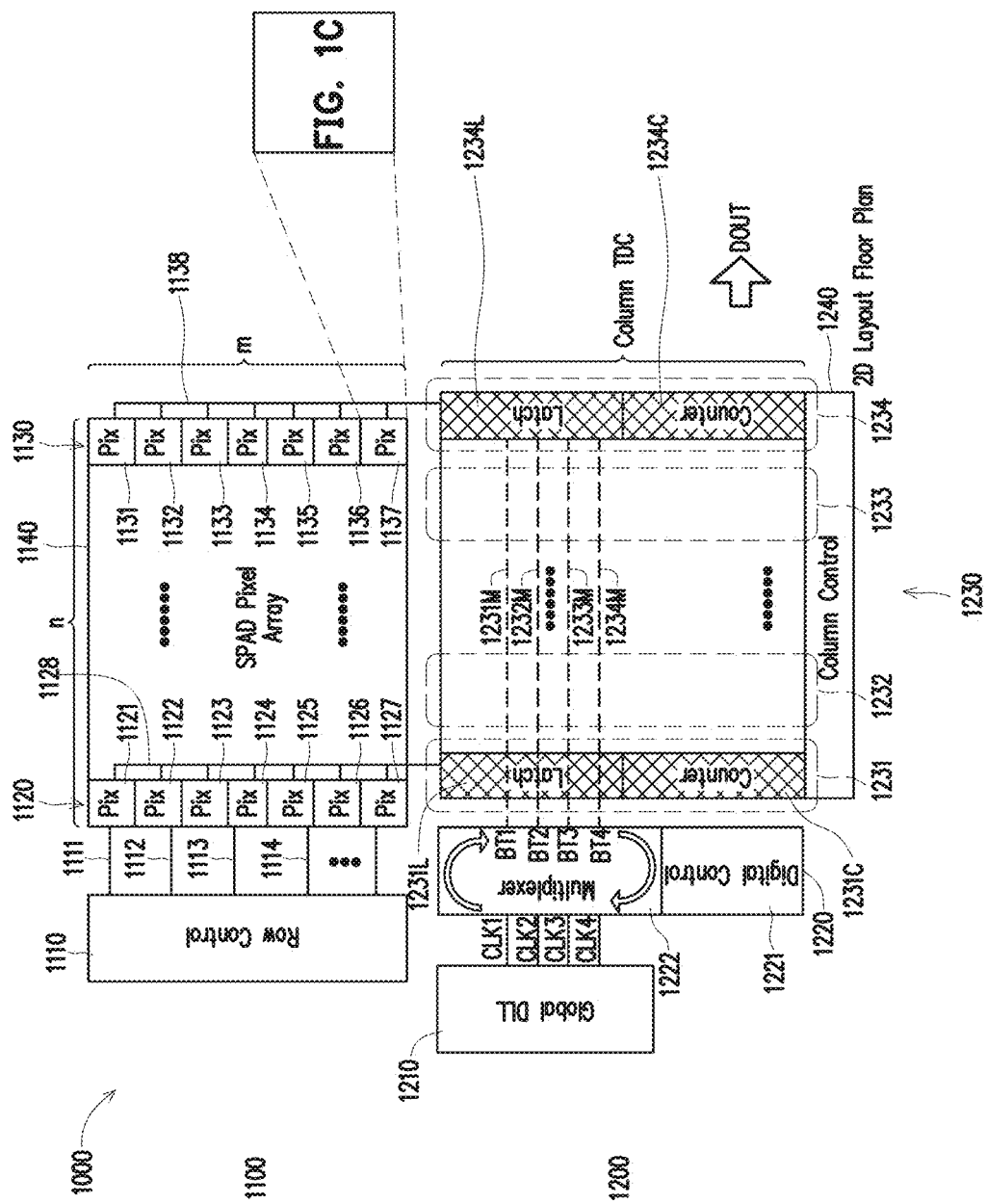

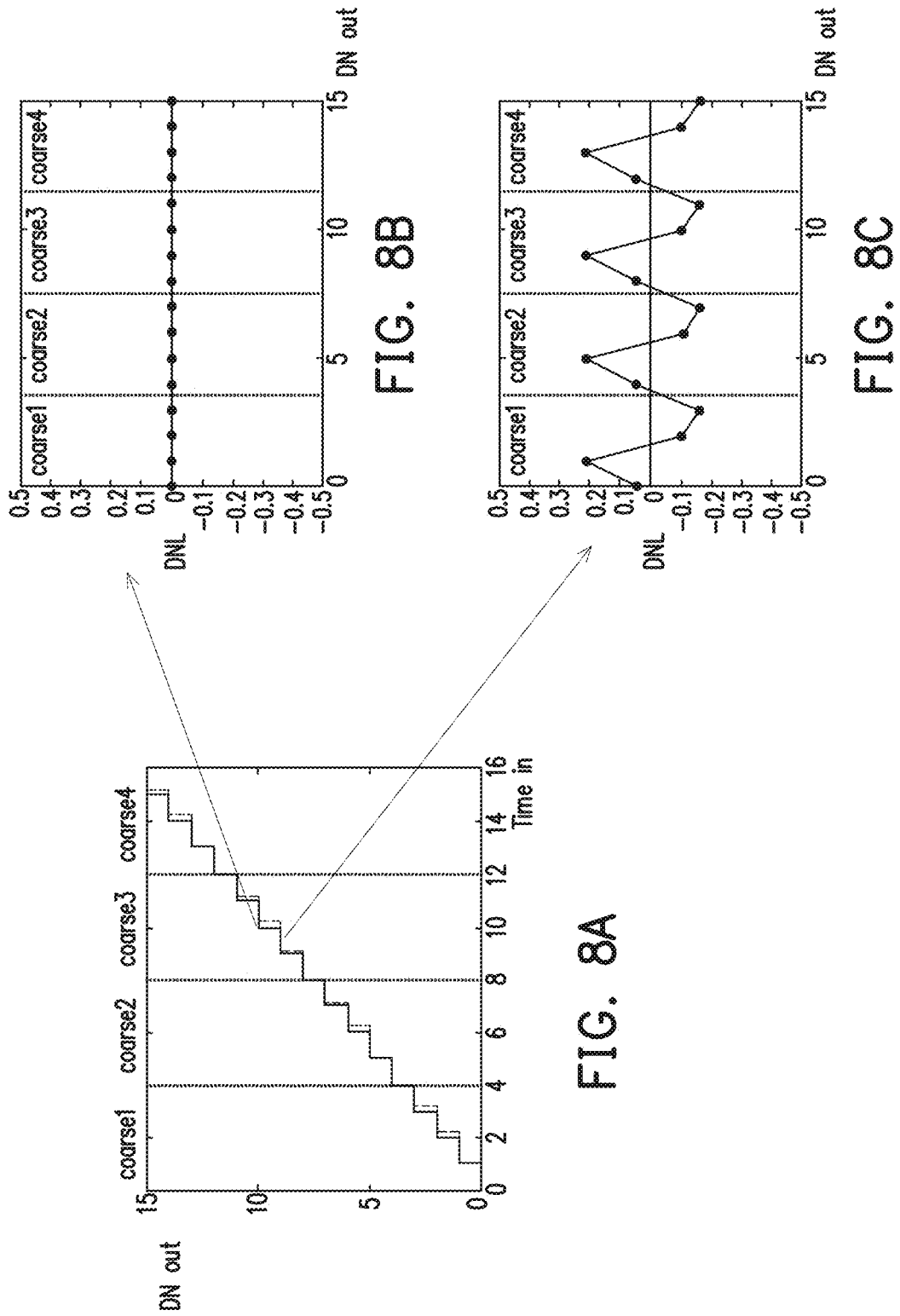

|  | Bit00 | Bit01 | Bit10 | Bit11 | Error Accumulation |
|---|---|---|---|---|---|
| Cycle1 | CLK1<br>σ1 | CLK2<br>σ1+σ2 | CLK3<br>σ1+σ2+σ3 | CLK4<br>σ1+σ2+σ3+σ4 | ≈0 |
| Cycle2 | CLK4<br>σ4 | CLK1<br>σ4+σ1 | CLK2<br>σ4+σ1+σ2 | CLK3<br>σ4+σ1+σ2+σ3 | ≈0 |
| Cycle3 | CLK3<br>σ3 | CLK4<br>σ3+σ4 | CLK1<br>σ3+σ4+σ1 | CLK2<br>σ3+σ4+σ1+σ2 | ≈0 |
| Cycle4 | CLK2<br>σ2 | CLK3<br>σ2+σ3 | CLK4<br>σ2+σ3+σ4 | CLK1<br>σ2+σ3+σ4+σ1 | ≈0 |
| Error Accumulation | ≈0 | ≈0 | ≈0 | ≈0 | |

- For each cycle, circularly shift 1 DLL output terminal to column latch
- After N cycle frame data collection, the timing skew of each delay element will be accumulated averagely, TDC Differential Nonlinearity (DNL) will be improved

FIG. 9

TIME-TO-DIGITAL CONVERTER CIRCUIT AND METHOD FOR SINGLE-PHOTON AVALANCHE DIODE BASED DEPTH SENSING

CROSS-REFERENCE TO RELATED APPLICATIONS

This application claims priority to U.S. Provisional Application No. 62/696,389, filed Jul. 11, 2018, entitled "Self-Calibration Time-to-Digital Converter for Single-Photon Avalanche Diode Based Depth Sensing," which is incorporated herein by reference in its entirety.

BACKGROUND

An integrated circuit (IC) is an electronic circuit manufactured into the surface of a thin substrate of semiconductor material. ICs are used in virtually all electronic equipment today and have revolutionized the world of electronics. Computers, mobile phones, and other digital home appliances are now inextricable parts of the structure of modern societies, made possible by the low cost of producing ICs.

BRIEF DESCRIPTION OF THE FIGURES

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is another diagram illustrating a time-to-digital converter (TDC) integrated circuit for single-photon avalanche diode based depth sensing, according to some embodiments.

FIGS. 8A-8C are figures illustrating the performance of time-to-digital converter with and without skew with simulation, according to some embodiments.

FIG. 9 is a table illustrating the error accumulation in clock cycles, according to some embodiments.

DETAILED DESCRIPTION

Figure 1A:
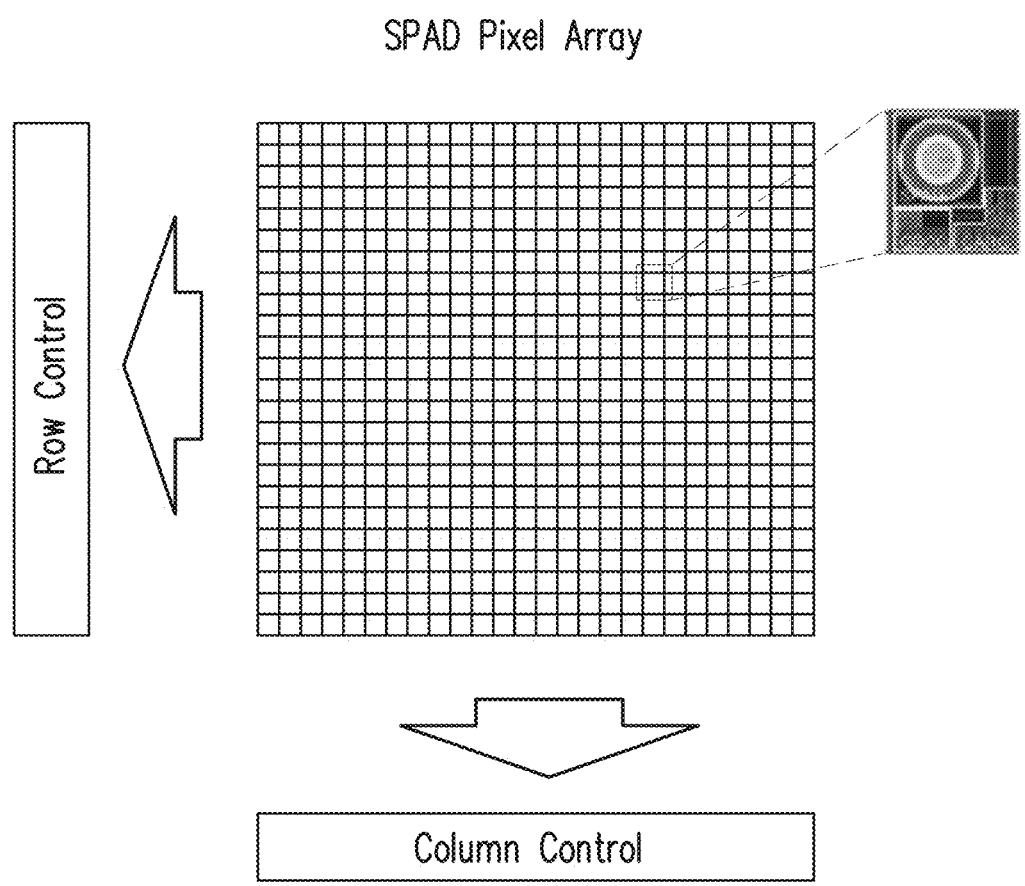
FIG. 1A is a diagram illustrating a time-to-digital converter integrated circuit for single-photon avalanche diode based depth sensing, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Time-of-Flight (ToF) is a method for measuring the distance between a sensor and an object, based on the time difference between the emission of a signal and its return to the sensor after being reflected by an object. Depth sensing is also known as range sensing. Depth imaging ToF cameras are highly advanced LIDAR (light detection and ranging) devices which replace the standard point by point scanning laser beams with a single light pulse to achieve full spatial awareness. Depth sensing cameras can be implemented to track facial or hand movements, map out a room and navigate a self-driving vehicle, etc.

A single-photon avalanche diode (SPAD) is a solid-state photodetector, in which, through an internal photoelectric effect, a photon-generated carrier can trigger a short-duration but relatively large avalanche current. That is, when a photon is received, avalanche current indicating the detection is generated. This avalanche current is created through a mechanism called impact ionization, in which, electrons and/or holes, as carriers, are accelerated to high kinetic energies through a large potential gradient. If the kinetic energy of a received electron, or a hole, is large enough (as a function of the ionization energy of the bulk material), additional carriers (electrons and/or holes) are liberated from the atomic lattice. As a result, the number of carriers increases exponentially from as few as a single carrier to create the avalanche current. SPAD is capable of detecting different types of low-intensity ionizing radiation, including: gamma, X-ray, beta, and alpha-particle radiation along with electromagnetic signals in the UV, Visible and IR down to the single photon level. SPADs are also capable of distinguishing the arrival times of events (photons) at high accuracy with a timing jitter of only a few tens of picoseconds. The SPADs differ from avalanche photodiodes (APDs) in that SPADs are specifically designed to operate with a reverse-bias voltage far above the breakdown voltage. SPADs have recently been implemented in LIDAR, ToF 3D Imaging, PET scanning, single-photon experimentation, fluorescence lifetime microscopy and optical communications, particularly quantum key distribution.

SPAD based depth sensing requires high resolution time-to-digital converter (TDC) to quantize ToF information. The effective resolution of TDC is limited by differential non-linearity (DNL) and integral nonlinearity (INL). A self-calibration TDC for SPAD based depth sensing implements a multiplexer from each output terminal of the global delay-locked loop (DLL) to the same latch cells in column TDC. Each latch cells route to one of all the output terminal of the global DLL circularly in turn. A digital control logic circuit circularly multiplex route between column latch and global DLL output.

FIG. 1A is a diagram illustrating a time-to-digital converter integrated circuit for single-photon avalanche diode based depth sensing, according to some embodiments. According to some embodiments, the SPAD pixel array includes a matrix of pixels, each pixel is a detector for detecting incoming photons. The SPAD pixel array is controlled by row control and column control, which will be discussed in more details below. The row control and column control process information received by each pixel to produce a pixel matrix representing an image.

Figure 1C:
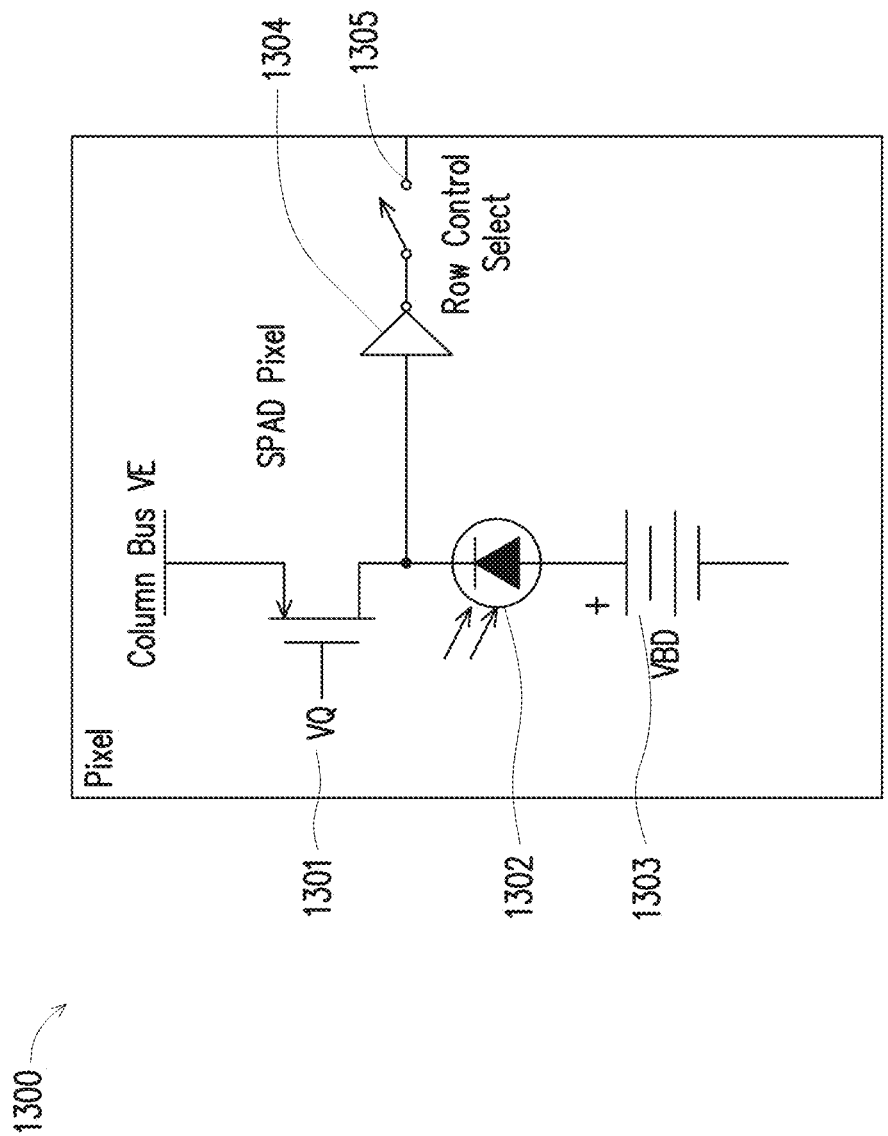
FIG. 1C is a diagram illustrating the structure of a TDC pixel, according to some embodiments.

FIG. 1B is another diagram illustrating a time-to-digital converter integrated circuit for single-photon avalanche diode based depth sensing, according to some embodiments. According to some embodiments, a time-to-digital converter (TDC) integrated circuit for single-photon avalanche diode (SPAD) based depth sensing is deployed on the two-dimensional (2D) floor plan, as illustrated in FIG. 1B. The TDC 1000 includes a detector module 1100 and a self-calibration module 1200. According to some embodiments, the detector module 1100 includes a row-control unit 1110, and a SPAD pixel array 1140. The detailed structure of a SPAD pixel is illustrated in FIG. 1C below. The SPAD pixel array 1140 is an array or a matrix of SPADs, each SPAD forming a pixel. According to some embodiments, the SPAD pixel matrix 1140 includes m rows and n columns of SPADS, forming a m by n SPAD pixel matrix. According to some embodiments, the first SPAD pixel column 1120 includes m SPADs, for example, there are seven SPADs (1121~1127) in the first column 1120, and m=7. Similarly, there are m SPADs (1131~1137) in the last column 1130. For each SPAD column in between the first column 1120 and the last column 1130, there are m SPADs. According to some embodiments, for each column of SPADs, there is a column bus connecting all m SPADs in that column. For example, the first column bus 1128 connects all m SPADs in the first column. Similarly, the last column bus 1138 connects all m SPADs in the last column. For each SPAD column in between the first column 1120 and the last column 1130, there is a column bus connecting all m SPADs in that column. According to some embodiments, the row control unit 1110 controls SPADs in each row.

According to some embodiments, the self-calibration module 1200 includes a global DLL unit 1210, a multiplex control unit 1220 and a column TDC array 1230. According to some embodiments, the global DLL unit 1210 includes a plurality of buffers, a phase detector and a charge pump. In the example illustrated in FIG. 1B, there are four buffers and four clock outputs: CLK1, CLK2, CLK3, and CLK4. The detailed structure of the global DLL will be discussed in FIG. 4A and other subsequent figures below. According to some embodiments, the multiplex control unit 1220 includes a digital controller 1221 and a circular multiplexer 1222. According to some embodiments, the circular multiplexer 1222 circularly routes signals between clock outputs (CLK1, CLK2, CLK3, CLK4) and BT1, BT2, BT3, BT4 corresponding to four latches (1231L, 1232L, 1233L, 1234L) in the column TDC array 1230 respectively. The detailed operations of the circular multiplexer 1222 will be discussed in FIGS. 4A and 4B below. According to some embodiments, the column TDC array 1230 includes n TDCs, for example, 1231, 1232, 1233 and 1234, with each TDC including a counter and a latch. The counter of TDC 1231 is labelled as 1231C, and the latch of TDC 1231 is labelled as 1231L. The counters and latches of other TDCs 1232~1234 are labelled similarly. According to some embodiments, the number of TDCs in the column TDC array 1230 is equal to the number of columns n of the SPAD pixel matrix 1140, each TDC in the column TDC array 1230 is connected to a corresponding column bus connecting a column of SPADs in the SPAD pixel matrix 1140. For example, the TDC 1231 is connected to the column bus 1128, which connects all SPADs in the first column 1120, namely, 1121 through 1127. Similarly, the TDC 1234 is connected to the column bus 1138, which connects all SPADs in the last column 1130, namely, 1131 through 1137. According to some embodiments, four latches 1231L, 1232L, 1233L and 1234L in the respective TDCs are connected to the circular multiplexer 1222 through lines 1231M, 1232M, 1233M and 1234M respectively.

FIG. 1C is a diagram illustrating the structure of a TDC pixel, according to some embodiments. According to some embodiments, the TDC pixel 1300 includes an FET transistor 1301, whose drain is connected to a SPAD 1302. The FET transistor 1301 is connected to a positive bias voltage VAPD, the SPAD 1302 is connected to VBD, where VBD is the SPAD breakdown voltage. When a photon enters the SPAD, negative voltage pulses with an amplitude of approximately VE=VAPD−VBD are generated at the SPAD cathode. According to some embodiments, the FET transistor 1301 and the SPAD 1302 are also connected to an inverter 1304, which is further connected to a switch 1305 doe row control. According to some embodiments, when the row control switch 1305 is controlled to be closed, or enabled, or selected, the SPAD 1302 is selected, and if a photon enters the SPAD, a signal is generated on VE. VE is connected to the column bus, for example 1128, or 1138. Otherwise, if the row control switch 1305 is controlled to be open, or disabled, or de-selected, even if there is a photon entering the SPAD, no signal is generated.

According to some embodiments, the row control 1110 controls each row of SPADs to ensure that at each time point, only a single SPAD in a given row is switched on, or selected, or enabled, which means, only the SPAD signal on that specific "selected" SPAD pixel is transmitted for further signal processing. According to some embodiments, the "selected" SPAD pixel signal is transmitted through the corresponding column bus to the corresponding TDC.

Figure 2A:
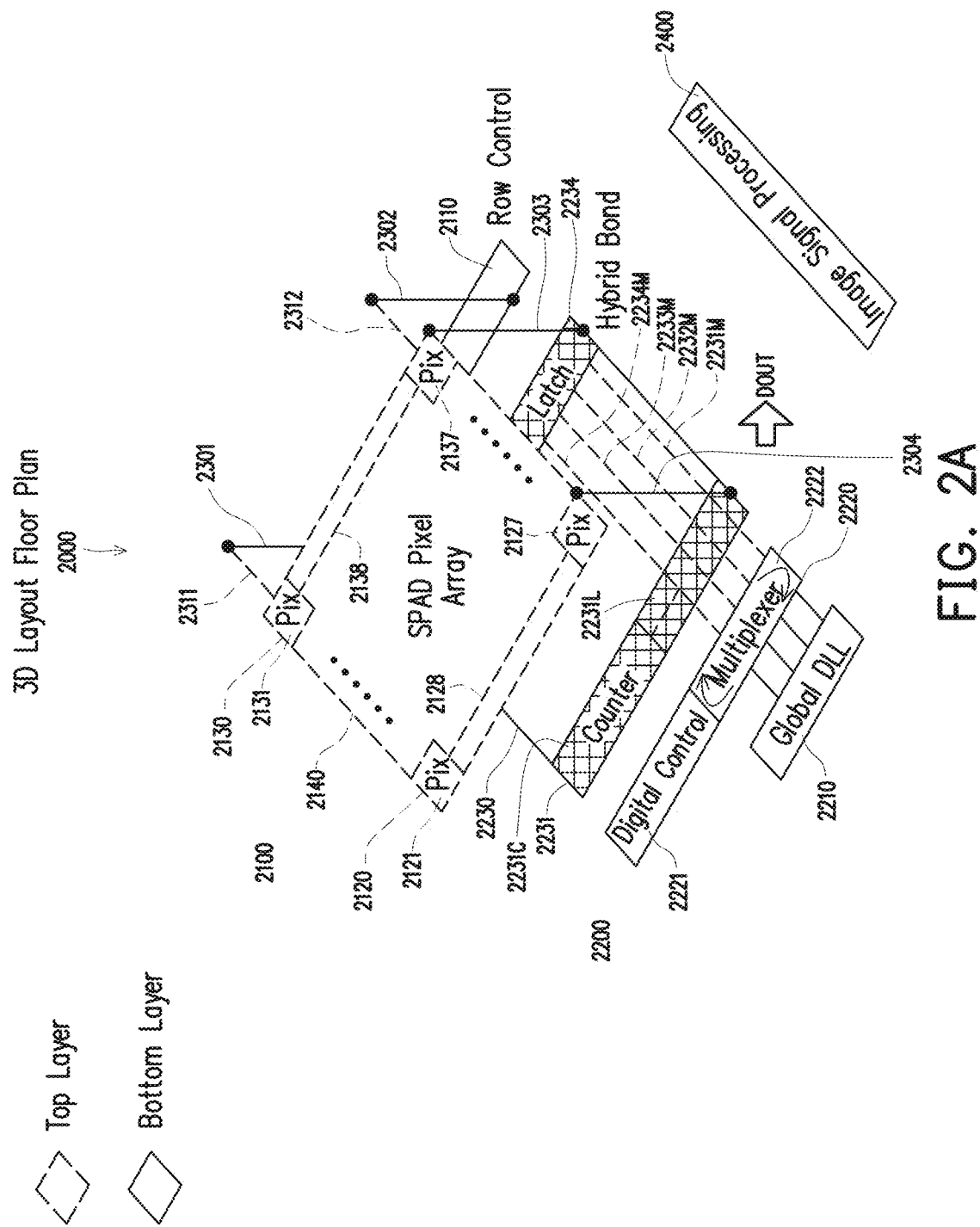
FIG. 2A is a diagram illustrating a three-dimensional time-to-digital converter integrated circuit for single-photon avalanche diode based depth sensing with two layers, according to some embodiments.

FIG. 2A is a diagram illustrating a 3D time-to-digital converter integrated circuit for single-photon avalanche diode based depth sensing with two layers, according to some embodiments. According to some embodiments, a 3D TDC integrated circuit for SPAD based depth sensing 2000 is a 3D implementation of the 2D floor plan 1000 illustrated in FIG. 1B. According to some embodiments, the 3D TDC integrated circuit for SPAD based depth sensing 2000 includes components similar to the 2D integrated circuit 1000, the difference is that the integrated circuit 2000 is deployed in a 3D manner. According to some embodiments, the detector module 2100 and the self-calibration module 2200 are deployed on different layers, instead of on the same layer as illustrated in FIG. 1B. The 3D TDC integrated circuit for SPAD based depth sensing 2000 includes the detector module 2100 stacked on the top of the self-calibration module 2200, with the detector module 2100 and the self-calibration module 2200 facing each other. Similar to the 2D circuit in FIG. 1B, the column bus 2128 connects all SPAD pixels in column 2120, and the column bus 2138 connects all SPAD pixels in column 2130. According to some embodiments, the column bus 2128 connects to the corresponding TDC 2231(2231L+2231C) through a hybrid bond 2304, which extends vertically from the surface of the self-calibration module 2200 to the surface of the detector module 2100. Similarly, the column bus 2138 connects to the corresponding TDC 2234 through a hybrid bond 2303, which also extends vertically from the surface of the self-calibration module 2200 to the surface of the detector module 2100. For each column of SPAD pixels, there is a column bus connecting all the SPAD pixels in that column, and there is a corresponding hybrid bond connecting the column bus in the SPAD pixel array layer to the corresponding TDC in the self-calibration layer. According to some embodiments, similar to the 2D floor plan illustrated in FIG. 1B, all latches in each TDC are connected to the circular multiplexer 2222 in the multiplex control unit 2220 in the same way as illustrated in FIG. 1B. In the example illustrated in FIG. 2A, there are four lines 2231M, 2232M, 2233M and 2234M corresponding to four clocks similar to the discussion in FIG. 1 above. The circular multiplexer 2222 in turn is connected to the global DLL 2210 in the same way as illustrated in FIG. 1B. According to some embodiments, the row control unit 2110 is deployed in the same layer as the self-calibration module 2200, and each SPAD pixel is connected to the row control unit 2110 through a hybrid bond, for example, the SPAD pixel 2137 is connected to the row control unit 2110 through the hybrid bond 2302, and the SPAD pixel 2131 is connected to the row control unit 2110 through the hybrid bond 2301. As discussed in FIGS. 1A and 1B, the row control 1110 controls each row of SPADs to ensure that at each time point, only a single SPAD in a given row is switched on, or selected, or enabled, which means, only the SPAD signal on that specific "selected" SPAD pixel is transmitted for further signal processing. According to some embodiments, the "selected" SPAD pixel signal is transmitted through the corresponding column bus, then through the corresponding hybrid bond to the corresponding TDC. According to some embodiments, the output from the TDCs 2230 are transmitted to an image signal processing unit 2400. According to some embodiments, image signal processing unit 2400 is also in the bottom layer, or the same layer as the TDCs. According to some embodiments, the 3D floor plan of the TDC integrated circuit for SPAD based depth sensing 2000 significantly saves space on the surface of silicon chips, compared to the 2D floor plan 1000. In addition, the 3D floor plan also reduces the length of wirings between the SPAD pixels and the TDC because the interlayer hybrid bonds are significantly shorter than the corresponding wirings in the 2D floor plan. In return, the shortened wirings reduces power consumption and timing delays.

Figure 2B:
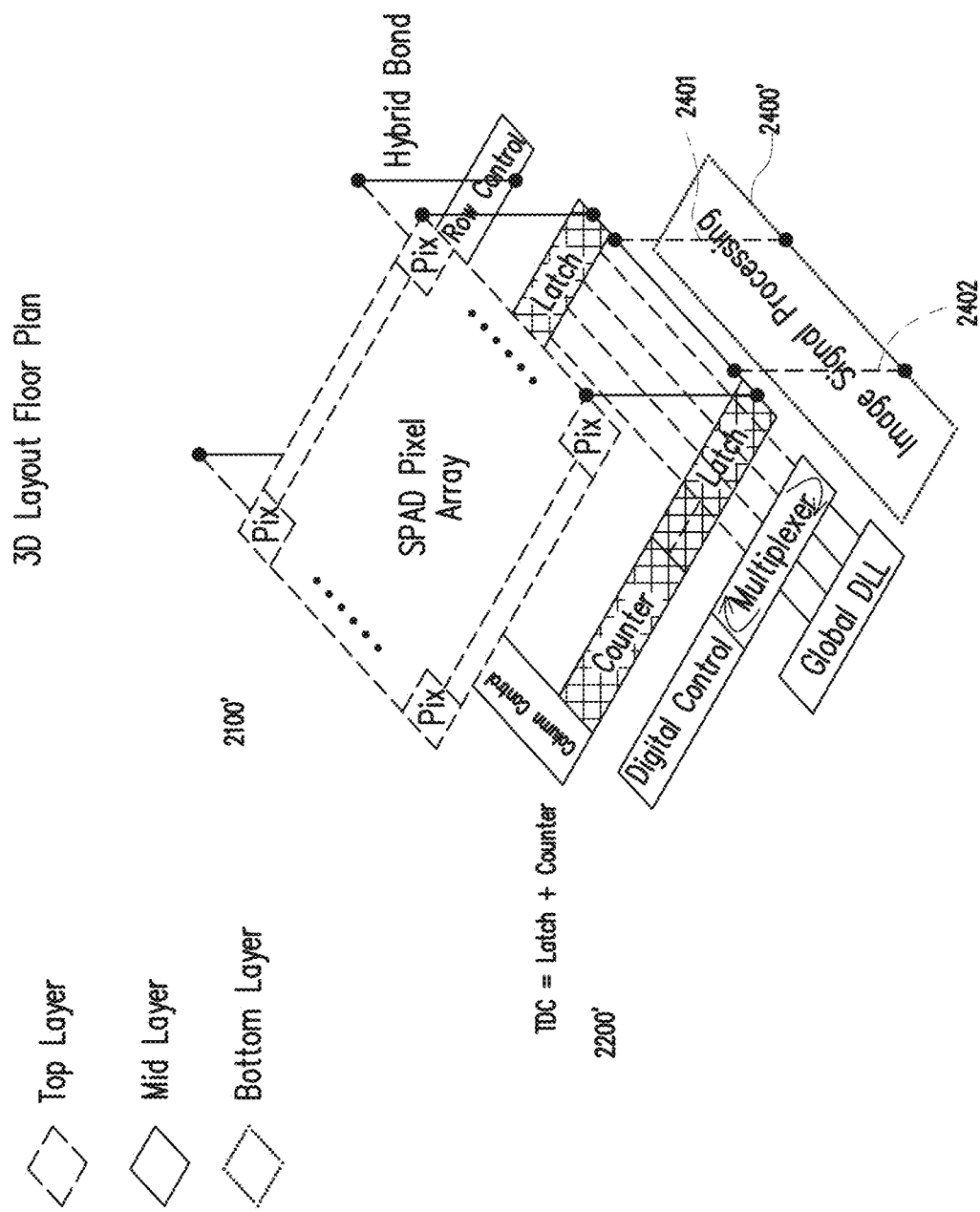
FIG. 2B is a diagram illustrating a three-dimensional time-to-digital converter integrated circuit for single-photon avalanche diode based depth sensing with three layers, according to some embodiments.

FIG. 2B is a diagram illustrating a 3D time-to-digital converter integrated circuit for single-photon avalanche diode based depth sensing with three layers, according to some embodiments. According to some embodiments, in addition to the two layers in FIG. 2A, a third layer is implemented, the SPAD pixel array 2100' is implemented in the top layer, the TDC array 2200' is implemented in the mid layer, and the image signal processing unit 2400' is implemented in the bottom layer. According to some embodiments, the TDCs in the mid layer 2300' are connected to the image signal processing unit 2400' in the bottom layer through through-silicon vias, or TSVs, such as 2401 and 2402. According to some embodiments, compared to FIG. 2A, the three-layered implementation in FIG. 2B further saves space on the surface of silicon, further shortens wirings and further reduces power consumption and timing delays.

Figure 3A:
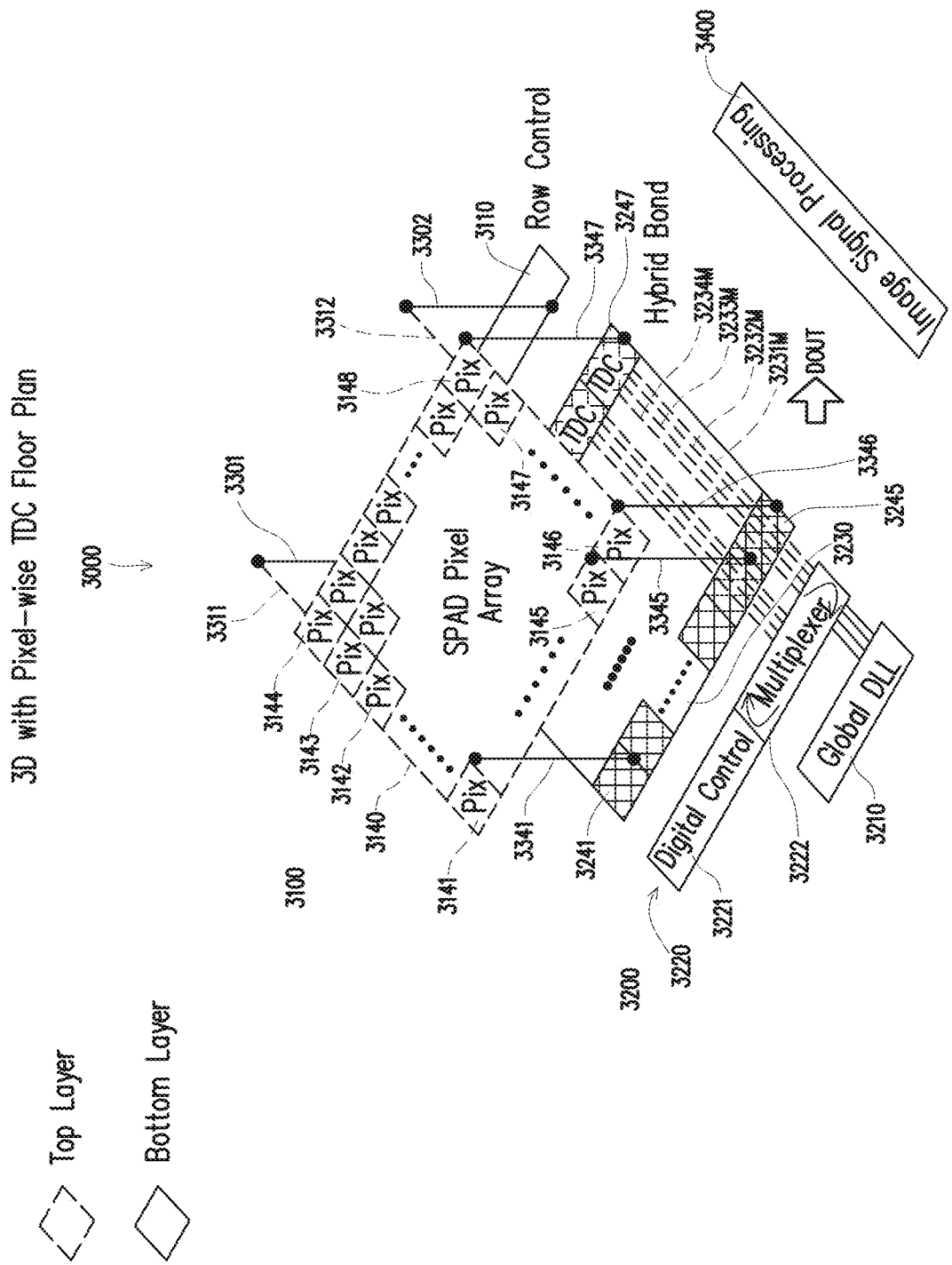
FIG. 3A is a diagram illustrating a three-dimensional pixel-wise time-to-digital converter integrated circuit for single-photon avalanche diode based depth sensing with two layers, according to some embodiments.

FIG. 3A is a diagram illustrating a 3D pixel-wise TDC integrated circuit for SPAD based depth sensing with two layers, according to some embodiments. According to some embodiments, 3D pixel-wise TDC integrated circuit for SPAD based depth sensing 3000 is similar to the 3D TDC integrated circuit for SPAD based depth sensing 2000, and the difference is that, instead of using column buses to connect all SPAD pixels in the same column, there is no column bus in 3D pixel-wise TDC integrated circuit for SPAD based depth sensing 3000. According to some embodiments, the number of TDCs is equal to the number of SPAD pixels. According to some embodiments, each individual SPAD pixel is connected to a corresponding TDC in the self-calibration layer 3200 through a hybrid bond. According to some embodiments, corresponding to the m×n SPAD pixel matrix, the TDCs are also arranged as a m×n matrix with each TDC directly under each corresponding SPAD pixel connected through a hybrid bond for easier wiring. According to some embodiments, the output of the TDCs are transmitted to an image signal processing unit 3400 for further processing.

Figure 3B:
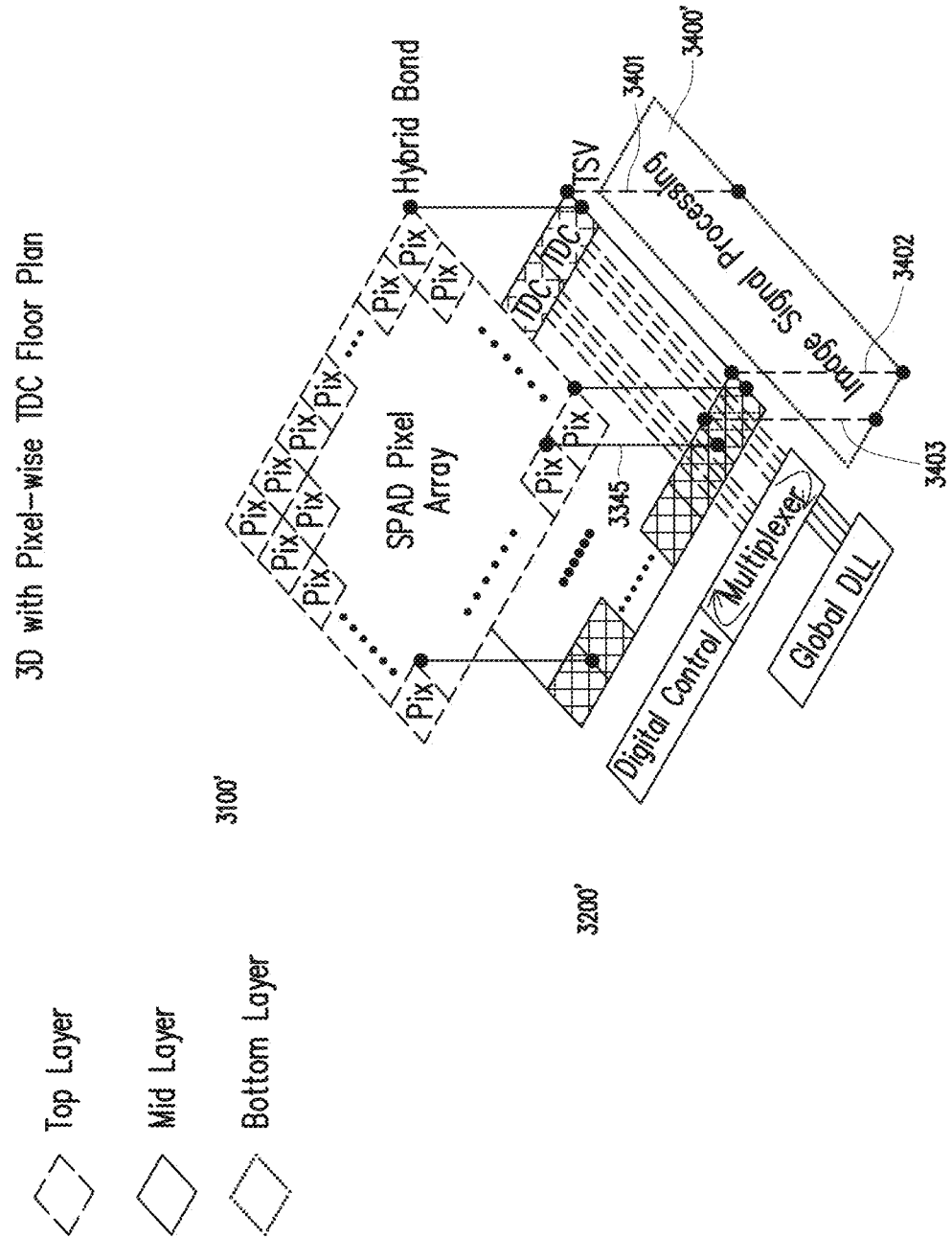
FIG. 3B is a diagram illustrating a three-dimensional pixel-wise time-to-digital converter integrated circuit for single-photon avalanche diode based depth sensing with three layers, according to some embodiments.

FIG. 3B is a diagram illustrating a 3D pixel-wise TDC integrated circuit for SPAD based depth sensing with three layers, according to some embodiments. According to some embodiments, similar to the difference between FIGS. 2A and 2B, in addition to the two layers in FIG. 3A, a third layer is implemented, the SPAD pixel array 3100' is implemented in the top layer, the TDC array 3200' is implemented in the mid layer, and the image signal processing unit 3400' is implemented in the bottom layer. According to some embodiments, the TDCs in the mid layer 3200' are connected to the image signal processing unit 3400' in the bottom layer through TSVs, such as 3401, 3402 and 3403. According to some embodiments, compared to FIG. 3A, the three-layered implementation in FIG. 3B further saves space on the surface of silicon, further shortens wirings and further reduces power consumption and timing delays.

According to some embodiments, the implementations in FIGS. 1A, 2A and 2B where column buses are implemented to connect corresponding columns of SPADs. At the same time, row control is implemented to select a single SPAD in each row. If there are m rows of SPAD pixels in the SPAD pixel array, then it take m clock cycles to sweep through all m rows of SPAD pixels. As a result, the SPAD pixel arrays in FIGS. 1A, 2A and 2B are not capable of taking an instantaneous image of an object. If the object is not fast moving, or not moving at all, then no distortion is created. But if the object is fast moving, then distortion is created in the final image because the signal in the first row and the final row is separated by m−1 clock cycles. As a comparison, the implantations in FIGS. 3A and 3B eliminate distortions in fast moving images by eliminating the column buses and transmitting signals on all m by n SPAD pixels to m by n TDCs at the same time without waiting for sweeping m clock cycles.

Figure 4A:
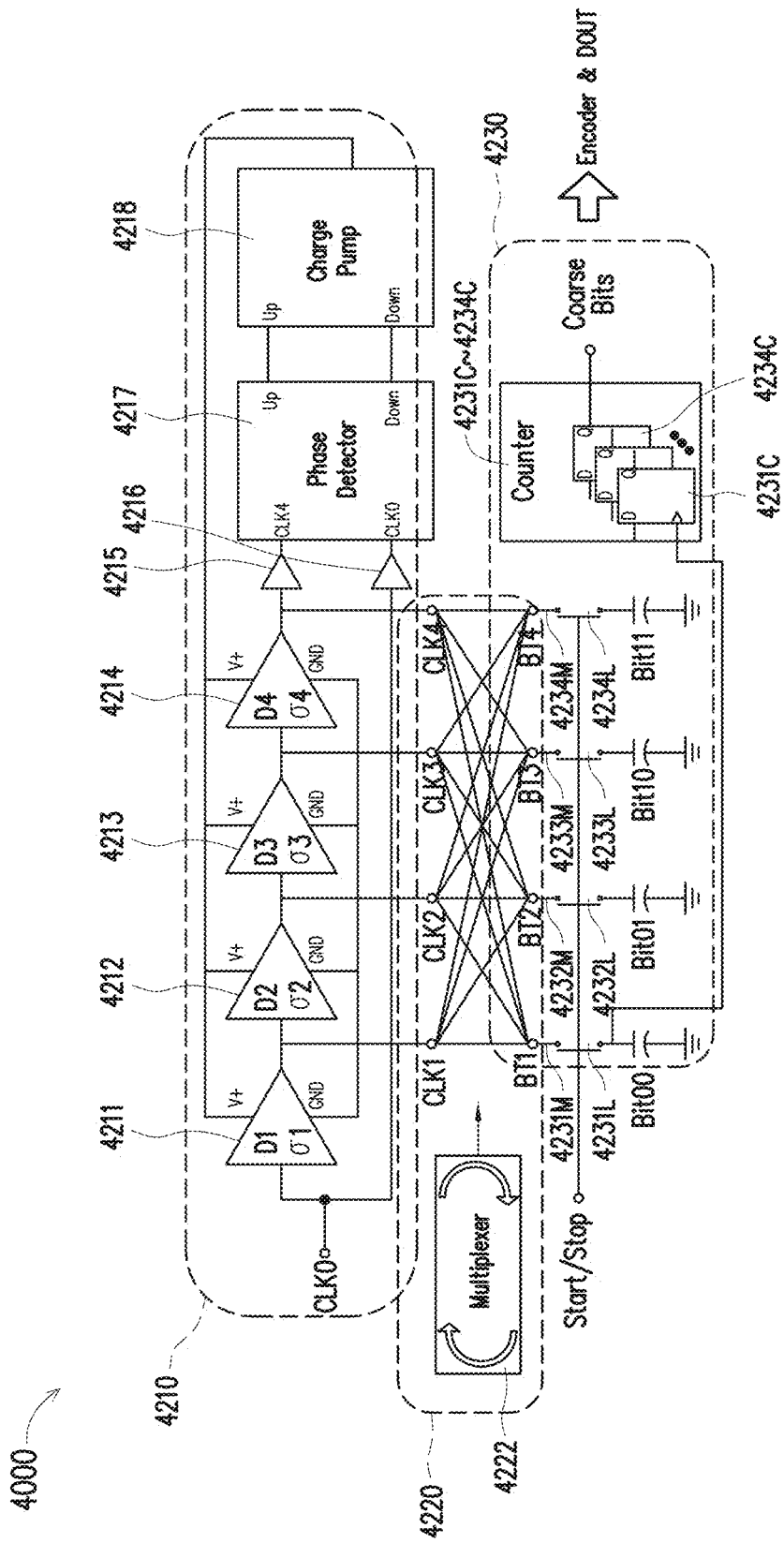
FIG. 4A is a diagram illustrating self-calibration TDC circuit with 4 buffers, according to some embodiments.

FIG. 4A is a diagram illustrating self-calibration time-to-digital converter circuit with 4 buffers, according to some embodiments. According to some embodiments, the self-calibration circuit 4000 includes a global DLL unit 4210, a circular multiplexer unit 4220, and a column TDC module 230. According to some embodiments, there are four buffers 4211(D1), 4212(D2), 4213(D3) and 4214(D4) implemented in serial to produce four clock signals CLK1, CLK2, CLK3 and CLK4 from CLK0. The ground GND of all buffers are connected together. According to some embodiments, the number of buffers is 2 k, where k is a positive integer, for example, the number of buffers can be 2, 4, 8, 16, 32, etc. four buffers are selected for illustration purpose. CLK 1 is implemented between buffers 4211 and 4212, CLK2 is implemented between buffers 4212 and 4213, CLK3 is implemented between buffers 4213 and 4214, CLK4 is implemented after buffer 4214. According to some embodiments, the phase difference between adjacent buffers σ1, σ2, σ3 and σ4 are the same and equal to π/2. According to some embodiments, the phase at CLK0 is 0, the phase at CLK1 is π/2, the phase at CLK2 is π, the phase at CLK3 is 3π/2, and the phase at CLK4 is 2π~0. According to some embodiments, the global DLL unit 4210 further include two amplifiers 4215 and 4216, a phase detector 4217 and a charge pump 4218. The amplifier 4215 is serially connected to the output of buffer 4214, where the CLK4 is taken, and the amplified CLK4 is further connected to the phase detector 4217. The amplifier 4216 is connected to CLK0 and the amplified CLK0 is connected to the phase detector 4217. The UP and DOWN of the phase detector 4217 are connected to the UP and DOWN of the charge pump 4218 respectively. The output of the charge pump 4218 is connected to the V+ of all buffers 4211~4214.

According to some embodiments, the circular multiplexer unit 4220 is a multiplexer which circularly switches CLK1, CLK2, CLK3 and CLK4 to BT1, BT2, BT3 and BT4 respectively. The detailed structure and operation of the circular multiplexer unit 4220 will be discussed in FIG. 4B below.

According to some embodiments, the column TDC module 4230 has a similar configuration as the column TDC module 1230 illustrated in FIG. 1B (and 2230 in FIG. 2A, and 3230 in FIG. 3A). According to some embodiments, the column TDC module 4230 includes a plurality, 4 in this example, of TDCs each including a counter and a latch. According to some embodiments, in the example illustrated in FIG. 4A, the column TDC module 4230 includes four TDCs with four latches 4231L~4234L and four counters 4231C~4234C. The four latches 4231L, 4232L, 4233L and 4234L are connected to the to the circular multiplexer unit 4220's BT1, BT2, BT3 and BT4 through 4231M, 4232M, 4233M and 4234M respectively in similar configurations illustrated in FIG. 1B, FIG. 2A and FIG. 3A. According to some embodiments, as discussed above, latches 4231C~4234L are each connected to respective counters 4231C~4234C to form TDCs 4231~4234. The latches 4231L~4234L are each connected capacitors Bit00, Bit01, Bit10 and Bit11. The latches 4231L~4234L receive the output from the SPAD pixel array.

Figure 4B:
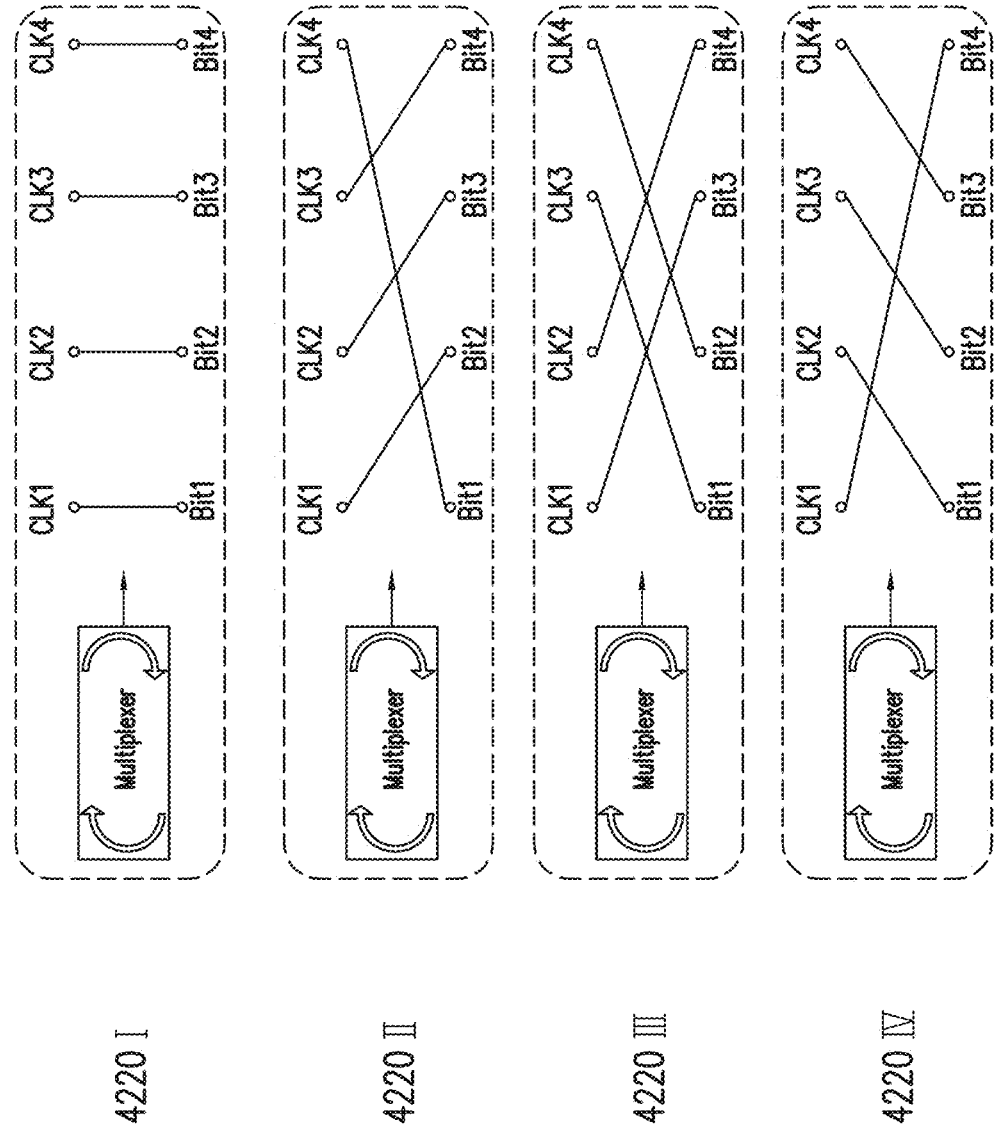
FIG. 4B is a diagram illustrating the operation of a circular multiplexer of the self-calibration TDC circuit with 4 buffers, according to some embodiments.

FIG. 4B is a diagram illustrating the operation of a circular multiplexer of the self-calibration time-to-digital converter circuit with 4 buffers, according to some embodiments. According to some embodiments, 4220I, 4220II, 4220III and 4220IV are four modes of multiplexing of the circular multiplexer unit 4220. According to some embodiments, in each mode and at any given time, each of CLK1, CLK2, CLK3 and CLK4 is only switched to one of BT1, BT2, BT3 and BT4, and each of BT1, BT2, BT3 and BT4 is switched to only one of CLK1, CLK2, CLK3 and CLK4. According to some embodiments, in each mode and at any given time, there is a one-to-one mapping between CLK1, CLK2, CLK3, CLK4 and BT1, BT2, BT3, BT4. According to some embodiments, in the first switching mode 4220I, CLK1 is switched to BT1, CLK2 is switched to BT2, CLK3 is switched to BT3, CLK4 is switched to BT4. According to some embodiments, in the second switching mode 4220II, CLK1 is switched to BT2, CLK2 is switched to BT3, CLK3 is switched to BT4, CLK4 is switched to BT1. According to some embodiments, in the third switching mode 4220III, CLK1 is switched to BT3, CLK2 is switched to BT4, CLK3 is switched to BT1, CLK4 is switched to BT2. According to some embodiments, in the fourth switching mode 4220IV, CLK1 is switched to BT4, CLK2 is switched to BT1, CLK3 is switched to BT2, CLK4 is switched to BT1. The above circular multiplexing is summarized in the table below:

| CLK1 | CLK2 | CLK3 | CLK4 |
|---|---|---|---|
| 4220I | | | |
| BT1 | BT2 | BT3 | BT4 |
| 4220II | | | |
| BT2 | BT3 | BT4 | BT1 |
| 4220III | | | |
| BT3 | BT4 | BT1 | BT2 |
| 4220IV | | | |
| BT4 | BT1 | BT2 | BT3 |

According to some embodiments, in a conventional approach, CLK1 is connected to BT1, CLK2 is connected to BT2, CLK3 is connected to BT3, CLK4 is connected to BT4, and no circular multiplexing is implemented.

Figure 4C:
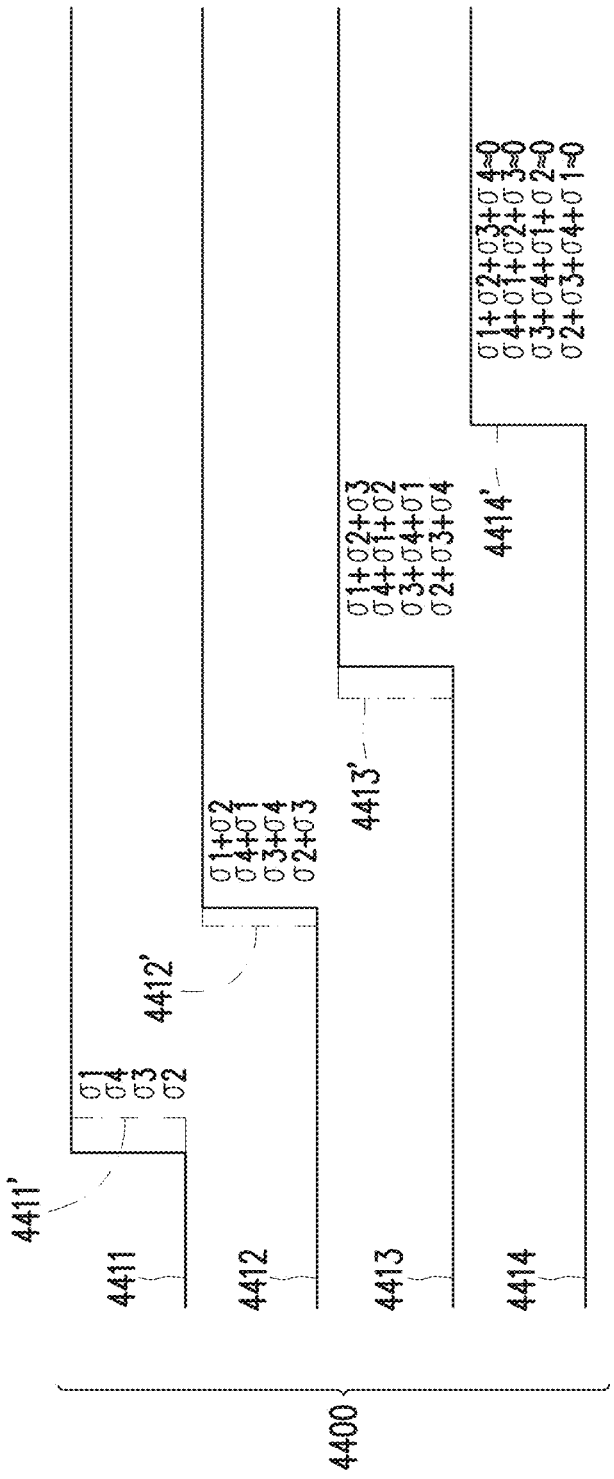
FIG. 4C are schematic diagrams illustrating the self-calibration operation of the circular multiplexer illustrated in FIG. 4B, according to some embodiments.

FIG. 4C are schematic diagrams illustrating the self-calibration operation of the circular multiplexer illustrated in FIG. 4B, according to some embodiments. According to some embodiments, the waveform 4411 corresponds to an ideal situation after the first switching 4220I where there is no noise caused phase variations, in comparison, the waveform 4411' is the actual situation after the first switching 4220I where there are phase fluctuations caused by noise: σ1, σ2, σ3 and σ4.

According to some embodiments, the waveform 4412 corresponds to an ideal situation after the first switching 4220I and the second switching 4220II where there is no noise caused phase variations, in comparison, the waveform 4412' is the actual situation after the first switching 4220I and the second switching 4220II where there are phase fluctuations accumulations caused by noise: σ1+σ2, σ2+σ3, σ3+σ4 and σ4+σ1.

According to some embodiments, the waveform 4413 corresponds to an ideal situation after the first switching 4220I, the second switching 4220II and the third switching 4220111 where there is no noise caused phase variations, in comparison, the waveform 4413' is the actual situation after the first switching 4220I, the second switching 4220II and the third switching 4220111 where there are phase fluctuations accumulations caused by noise: σ1+σ2+σ3, σ2+σ3+σ4, σ3+σ4+σ1 and σ4+σ1+σ2.

According to some embodiments, the waveform 4414 corresponds to an ideal situation after the first switching 4220I, the second switching 4220II, the third switching 4220III and the fourth switching 4220IV where there is no noise caused phase variations, in comparison, the waveform 4414' is the actual situation after the first switching 4220I, the second switching 4220II, the third switching 4220III and the fourth switching 4220IV, where there are phase fluctuations accumulations caused by noise: σ1+σ2+σ3+σ4, σ2+σ3+σ4+σ1, σ3+σ4+σ1+σ2 and σ4+σ1+σ2+σ3. As discussed above, σ1+σ2+σ3+σ4=2n, as a result, σ1+σ2+σ3+σ4=σ2+σ3+σ4+σ1=σ3+σ4+σ1+σ2=σ4+σ1+σ2+σ3=2π~0. The total delay is 2π, but the function of DLL forces the total variation of unit delay cell to zero. Accordingly, the waveform 4414' matches the ideal form 4414 without phase variations, and self-calibration is achieved through averaging out all the phase variations, as illustrated.

Figure 5:
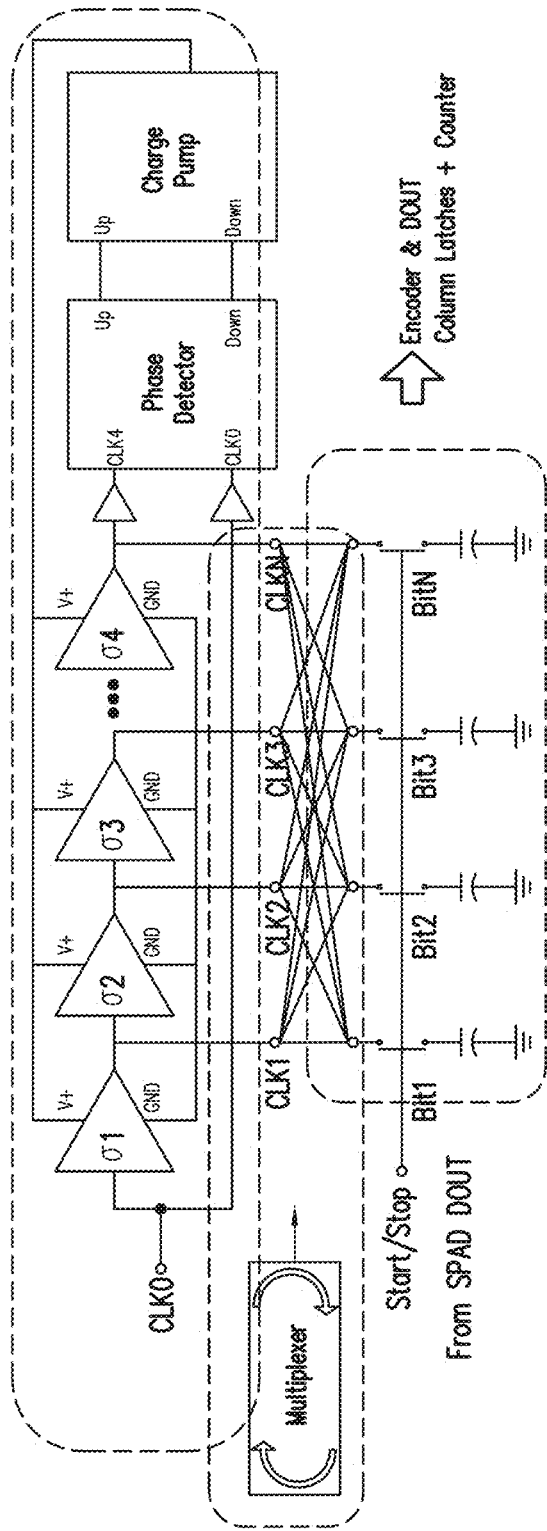
FIG. 5 is a diagram illustrating self-calibration TDC circuit with N buffers, according to some embodiments.

FIG. 5 is a diagram illustrating self-calibration TDC circuit with N buffers, according to some embodiments. According to some embodiments, the self-calibration TDC 5000 is similar to self-calibration TDC 4000, but instead of 4 buffers, there are N buffers in the self-calibration TDC 5000, where N=2 k, and k is a positive integer, for example, N=2, 4, 8, 16, 32, 64, etc. Accordingly, there are N column TDCs with corresponding latches and counters, and the circular multiplexer 5220 switches between N clocks (CLK1~CLK N) and N latches (BT1~BTN) in a similar fashion as illustrated in FIG. 4B.

According to some embodiments, for the same reason that σ1+σ2+σ3+σ4=2π~0 as discussed in FIG. 4C above, in the self-calibration TDC 5000, σ1+σ2+σ3+ . . . +σN=2π~0. Self-calibration is achieved by averaging out the phase variations in the same fashion as in the self-calibration TDC 4000.

Figure 6:
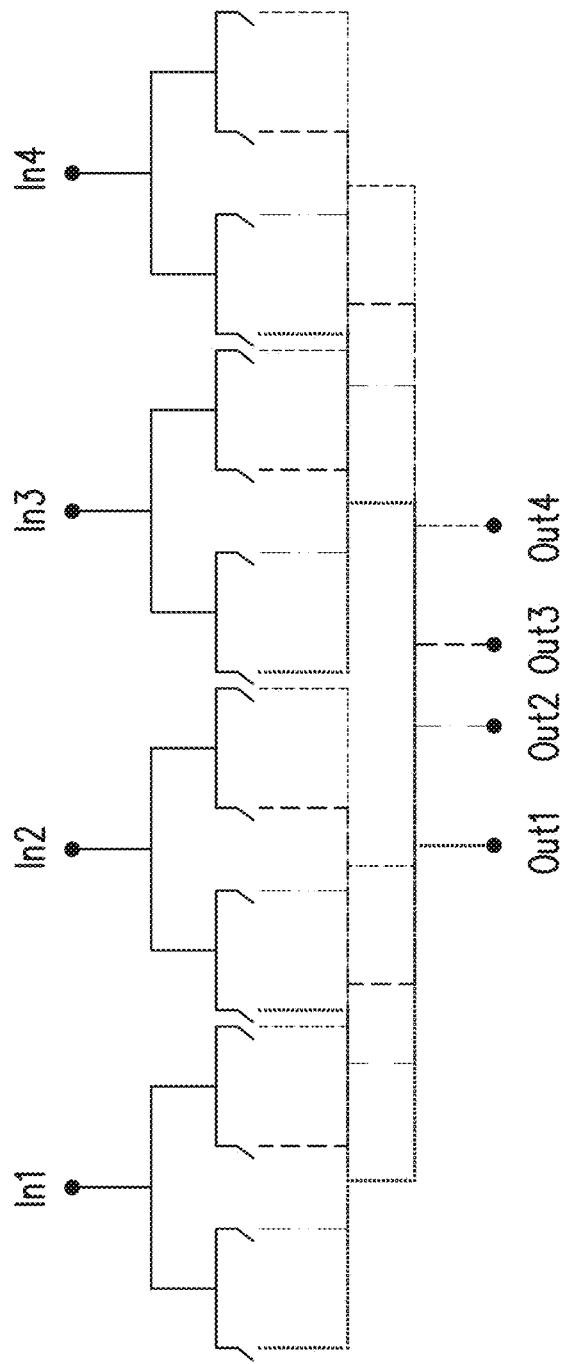
FIG. 6 is a diagram illustrating a balanced clock tree, according to some embodiments.

FIG. 6 is a diagram illustrating a balanced clock tree, according to some embodiments. A clock tree distributes a clock signal from a common point to all the elements that implement the clock signal. This function is critical to the operation of a synchronous system, as a result, the characteristics of the clock signals and the electrical networks implemented in their distribution are carefully designed.

According to some embodiments, clock signals are loaded with the greatest fanout and operate at the highest speeds of any signal within a synchronous system. According to some embodiments, the data signals are provided with a temporal reference by the clock signals, the clock waveforms must be clean and sharp. According to some embodiments, the clock signals are affected by technology scaling, in that the long global interconnect lines become significantly more resistive when line dimensions decreases. According to some embodiments, the increased line resistance is one of the major reasons for the increasing significance of clock distribution on synchronous performance. According to some embodiments, the control of any differences and uncertainty in the arrival times of the clock signals severely limit the maximum performance of the entire system and may create catastrophic race conditions in which an incorrect data signal may latch within a register.

According to some embodiments, in the balanced clock tree 6000, the routing of the wires are conducted so that the timing through wiring from In1 to Out1 is equal to the timing through wiring from In1 to Out2, equal to the timing through wiring from In1 to Out3, equal to the timing through wiring from In1 to Out4. The same applies to In2, where In2-Out1=In2-Out2=In2-Out3=In2-Out4. For In3, In3-Out1=In3-Out2=In3-Out3=In3-Out4; for In4, In4-Out1=In4-Out2=In4-Out3=In4-Out4.

Figure 7:
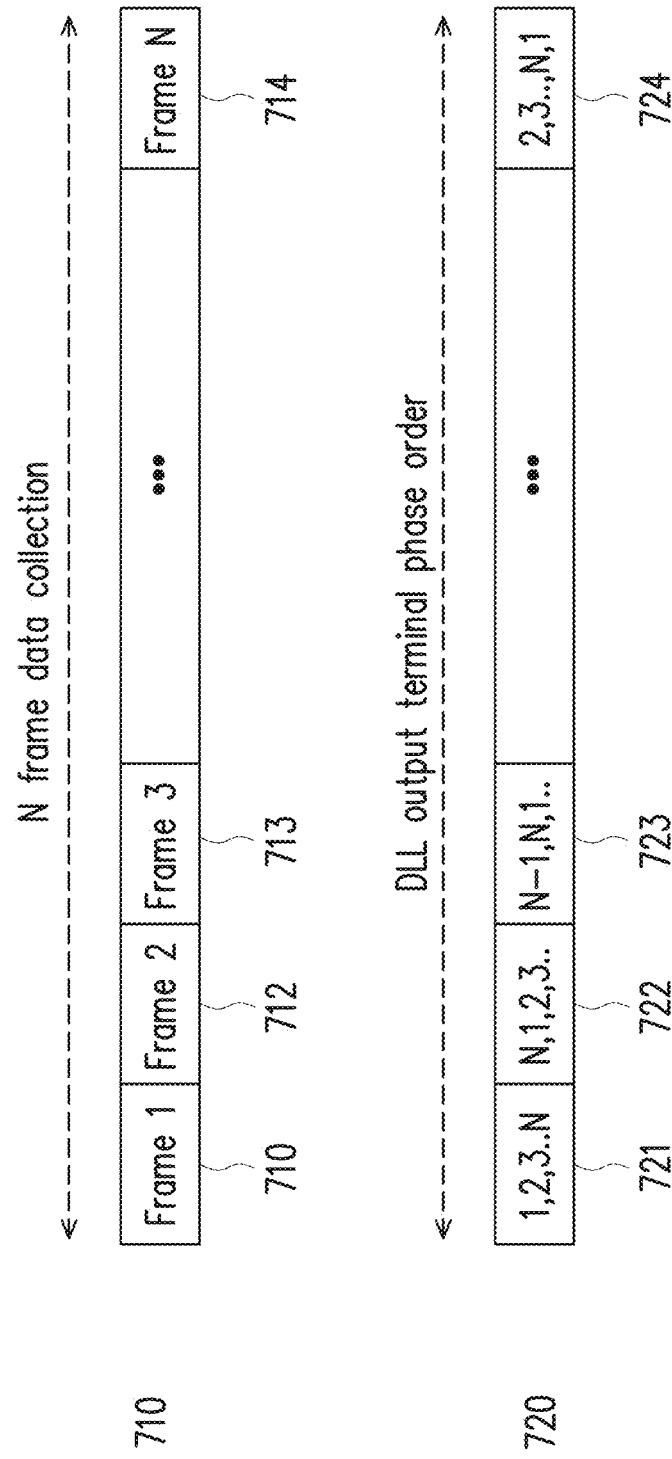
FIG. 7 is a diagram illustrating a circular multiplex digital control, according to some embodiments.

FIG. 7 is a diagram illustrating a circular multiplex digital control, according to some embodiments. According to some embodiments, 710 is N frame data collection, which includes: Frame 1, Frame 2, Frame 3, . . . , Frame N. According to some embodiments, 720 is a DLL output terminal phase order. As discussed above, the DLL output terminal phase order is [1, 2, 3, . . . , N], [N, 1, 2, 3, . . . ], [N-1, N, 1, 2, . . . ] . . . [2, 3, 4, . . . , N, 1].

FIGS. 8A-8C are figures illustrating the performance of TDC with and without skew with simulation, according to some embodiments. According to some embodiments, the horizontal axis in FIG. 8A is time in, and the vertical axis is ND out. The black curve in FIG. 8A is the simulation of an ideal situation which corresponds to FIG. 8B, and the dotted curve is the simulation of phase deviations which corresponds to FIG. 8C. FIG. 8B show no fluctuation, while in simulation, FIG. 8C shows fluctuation in coarse 1 through coarse 4.

FIG. 9 is a table illustrating the error accumulation in clock cycles, according to some embodiments. According to some embodiments, as discussed above, σ1+σ2+σ3+σ4=2π~0, the phase error accumulation is 0 vertically and horizontally. According to some embodiments, in cycle 1, terminal Bit00 receives CLK1 with error accumulation σ1, Bit01 receives CLK2 with error accumulation σ1+σ2, Bit10 receives CLK3 with error accumulation σ1+σ2+σ3 and Bit11 receives CLK4 with error accumulation σ1+σ2+σ3+σ4. In cycle 2, the clocks are circularly rotated, as a result, terminal Bit00 receives CLK4 with error accumulation σ4, Bit01 receives CLK1 with error accumulation σ4+σ1, Bit10 receives CLK2 with error accumulation σ4+σ1+σ2 and Bit11 receives CLK3 with error accumulation σ4+σ1+σ2+σ3. In cycle 3, the clocks are further circularly rotated, as a result, terminal Bit00 receives CLK3 with error accumulation σ3, Bit01 receives CLK4 with error accumulation σ3+σ4, Bit10 receives CLK1 with error accumulation σ3+σ4+σ1 and Bit11 receives CLK2 with error accumulation σ3+σ4+σ1+σ2. In cycle 4, the clocks are further circularly rotated, as a result, terminal Bit00 receives CLK2 with error accumulation σ2, Bit01 receives CLK3 with error accumulation σ2+σ3, Bit10 receives CLK3 with error accumulation σ2+σ3+σ4 and Bit11 receives CLK1 with error accumulation σ2+σ3+σ4+σ1. According to some embodiments, also referring to FIG. 5, for each cycle, one DLL output can be circularly shifted to the column latch. According to some embodiments, referring to FIG. 8A, after N cycle frame data collection, the timing skew of each delay element can be accumulated and averaged out, as a result, the TDC differential nonlinearity can be improved. As discussed above, σ1+σ2+σ3+σ4=2π~0, as a result, all error accumulation is close to zero.

Figure 10:
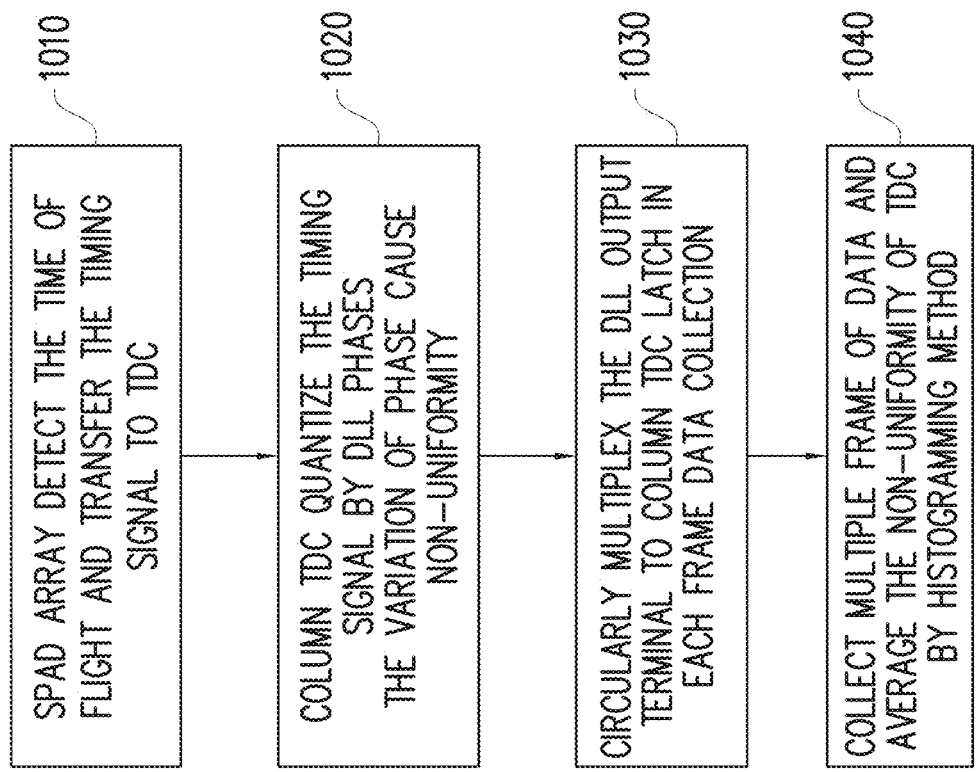
FIG. 10 is a flow chart illustrating the for time-to-digital converter (TDC) circuit self-calibration method, according to some embodiments.

FIG. 10 is a flow chart illustrating the for time-to-digital converter (TDC) circuit self-calibration method, according to some embodiments. According to some embodiments, at step 1010, in each frame of data collection, TDC transforming a time of flight signal from SPAD array to depth information; at step 1020, forming TDC by a global DLL with a plurality (M) of phase signals and column-wise latch sampling the phase; at step 1030, re-routing the global DLL output terminals with a circular multiplexer to column TDC latch in each frame data collection; and at step 1040, collecting multiple frames of data and averaging non-uniformity of TDC. According to some embodiments, at step 1030, the phase signal order can be shifted either clockwise, or counterclockwise. According to some embodiments, at step 1030, the phase signal order can be shifted a fixed number of phases in each frame data collection, the fixed number can be one or an integer larger than one. According to some embodiments, at step 1030, after M frames of data collections, all the output data can form a histogram with depth information distribution, which is called the "histogram method", or "histograming". According to some embodiments, the phase variations of DLL delay elements can be averaged out and thus the non-uniformity of TDC is reduced. According to some embodiments, in the histogram method, the dark count rate (DCR) and background illumination pulses are not correlated to the laser source, as a result, these pulses produce a spread out of noise floor. The ToF peak can be easily isolated from noise by applying a threshold, for example, the threshold is 10% of the peak value. And depth can be obtained by determining the average ToF value of the signal measurement.

According to some embodiments, a self-calibration time-to-digital converter (TDC) integrated circuit for single-photon avalanche diode (SPAD) based depth sensing is disclosed. The circuit includes: a SPAD matrix with a plurality of SPAD pixels arranged in m rows and n columns, the SPAD pixels in each column of SPAD pixels are connected by a column bus; a global DLL unit with n buffers and n clock signals; and an image signal processing unit for receiving image signals from the column TDC array. According to some embodiments, the circuit also includes a row control unit configured to enable one SPAD pixel in each row for a transmitting signal. According to some embodiments, the circuit also includes a circular n-way multiplexer for circularly multiplexing n clock signals in the global DLL unit. According to some embodiments, the circuit also includes a column TDC array with n TDCs, each TDC further comprises a counter and a latch, the latch of each TDC is connected to the circular n-way multiplexer for circular multiplexing.

According to some embodiments, the SPAD matrix is implemented in a first layer, and the column TDC array is implemented in a second layer different from the first layer, each column bus is connected to a corresponding column TDC through a corresponding hybrid bond. According to some embodiments, each of the n clock signals in the global DLL is connected to one and only one of the n latches in the column TDC array at a given time, each of the n clock signals in the global DLL is swept through all n latches in the column TDC array in n clock cycles. According to some embodiments, the row control unit is implemented in the second layer. According to some embodiments, the global DLL unit is implemented in the second layer. According to some embodiments, the circular n-way multiplexer unit is implemented in the second layer. According to some embodiments, the image signal processing unit is implemented in a third layer different from the first layer and the second layer.

According to some embodiments, a 3D pixel-wise self-calibration TDC integrated circuit for SPAD based depth sensing is disclosed. The circuit includes: a SPAD matrix with a plurality of SPAD pixels arranged in m rows and n columns implemented in a first layer; a row control unit configured to enable one and only one SPAD pixel in each row for a transmitting signal; a global DLL unit with n buffers and n clock signals; a circular n-way multiplexer for circularly multiplexing n clock signals in the global DLL unit to average out phase variations; a TDC matrix arranged in m rows and n columns implemented in a second layer below the first layer, each TDC is arranged directly below a corresponding SPAD pixel, the TDC is connected to the corresponding SPAD pixel through a hybrid bond; and an image signal processing unit for receiving image signals from the column TDC array. According to some embodiments, the image signal processing unit is implemented in the second layer. According to some embodiments, the image signal processing unit is implemented in a third layer below the second layer. According to some embodiments, each TDC is connected to the image signal processing unit through a TSV. According to some embodiments, the global DLL is implemented in the second layer. According to some embodiments, the circular n-way multiplexer unit is implemented in the second layer. According to some embodiments, each TDC further comprises a counter and a latch, wherein the latch of each TDC is connected to the circular n-way multiplexer for circular multiplexing.

According to some embodiments, a method for time-to-digital converter (TDC) circuit self-calibration is disclosed. The method includes the steps of: in each frame of data collection, TDC transforming a time of flight signal from SPAD array to depth information; forming TDC by a global DLL with a plurality of phase signal and column-wise latch sampling the phase; re-routing the global DLL output terminals with a circular multiplexer to column TDC latch in each frame data collection; collecting multiple frames of data; and averaging non-uniformity of TDC. According to some embodiments, the averaging of the non-uniformity of TDC is by a histogram method. According to some embodiments, in the step of re-routing the global DLL output terminals, the phase signal order is shifted clockwise. According to some embodiments, in the step of re-routing the global DLL output terminals, the phase signal order is shifted counterclockwise. According to some embodiments, in the step of re-routing the global DLL output terminals, the phase signal order is shifted at least one phase in each frame data collection. According to some embodiments, after circular multiplexing of the plurality of frame data collection, all output data forming a histogram with depth information distribution.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed:

1. A self-calibration time-to-digital converter (TDC) integrated circuit for single-photon avalanche diode (SPAD) based depth sensing, the circuit comprising:
   a SPAD matrix with a plurality of SPAD pixels arranged in m rows and n columns, wherein the SPAD pixels in each column of SPAD pixels are connected by a column bus;

a global delay-locked loop (DLL) unit with n buffers and n clock signals;

a circular n-way multiplexer for circularly multiplexing n clock signals in the global DLL unit; and an image signal processing unit for receiving image signals from a column TDC array.

2. The circuit of claim 1, wherein the circuit further comprises:

a row control unit configured to enable one SPAD pixel in each row for a transmitting signal.

3. The circuit of claim 2, wherein the circuit further comprises:

the column TDC array with n TDCs, wherein each TDC further comprises a counter and a latch, wherein the latch of each TDC is connected to the circular n-way multiplexer for circular multiplexing.

4. The circuit of claim 3, wherein the SPAD matrix is implemented in a first layer, and the column TDC array is implemented in a second layer different from the first layer, wherein each column bus is connected to a corresponding column TDC through a corresponding hybrid bond.

5. The circuit of claim 3, wherein each of the n clock signals in the global DLL is connected to one and only one of the n latches in the column TDC array at a given time, wherein each of the n clock signals in the global DLL is swept through all n latches in the column TDC array in n clock cycles.

6. The circuit of claim 4, wherein the row control unit is implemented in the second layer.

7. The circuit of claim 4, wherein the global DLL unit is implemented in the second layer.

8. The circuit of claim 4, wherein the circular n-way multiplexer is implemented in the second layer.

9. The circuit of claim 4, wherein the image signal processing unit is implemented in a third layer different from the first layer and the second layer.

10. A three-dimensional (3D) pixel-wise self-calibration time-to-digital converter (TDC) integrated circuit for single-photon avalanche diode (SPAD) based depth sensing, the circuit comprising:

a SPAD matrix with a plurality of SPAD pixels arranged in m rows and n columns implemented in a first layer;

a row control unit configured to enable one and only one SPAD pixel in each row for a transmitting signal;

a global delay-locked loop (DLL) unit with n buffers and n clock signals;

a circular n-way multiplexer for circularly multiplexing n clock signals in the global DLL unit to average out phase variations;

a TDC matrix arranged in m rows and n columns implemented in a second layer below the first layer, wherein each TDC is arranged directly below a corresponding SPAD pixel, wherein the TDC is connected to the corresponding SPAD pixel through a hybrid bond; and an image signal processing unit for receiving image signals from a column TDC array.

11. The circuit of claim 10, wherein the image signal processing unit is implemented in the second layer.

12. The circuit of claim 10, wherein the image signal processing unit is implemented in a third layer below the second layer.

13. The circuit of claim 11, wherein each TDC is connected to the image signal processing unit through a TSV.

14. The circuit of claim 10, wherein the global DLL is implemented in the second layer.

15. The circuit of claim 10, wherein the circular n-way multiplexer is implemented in the second layer.

16. The circuit of claim 10, wherein each TDC further comprises a counter and a latch, wherein the latch of each TDC is connected to the circular n-way multiplexer for circular multiplexing.

17. A method for time-to-digital converter (TDC) circuit self-calibration, the method comprising the steps of:

in each frame of data collection, TDC transforming a time of flight signal from a single-photon avalanche diode (SPAD) array to depth information;

column TDC quantizing timing signal by delay-locked loop (DLL) phases resulting in an output causing non-uniformity of TDC;

circularly multiplexing the output of the DLL to column TDC latch in each frame data collection;

collecting multiple frames of data; and averaging non-uniformity of TDC.

18. The method of claim 17, wherein the averaging of the non-uniformity of TDC is by a histogram method.

19. The method of claim 17, wherein in the step of circularly multiplexing the output of the DLL, a phase signal order is shifted clockwise.

20. The method of claim 17, wherein in the step of circularly multiplexing the output of the DLL, a phase signal order is shifted counter-clockwise.

21. The method of claim 17, wherein in the step of re-routing the global DLL output terminals, a phase signal order is shifted at least one phase in each frame data collection.

22. The method of claim 17, after circular multiplexing of the plurality of frame data collection, all output data forming a histogram with depth information distribution.

23. The method of claim 17, wherein the transforming, quantizing, multiplexing, and averaging are performed by a three-dimensional (3D) pixel-wise self-calibration TDC integrated circuit for SPAD based depth sensing comprising:

a SPAD matrix with a plurality of SPAD pixels arranged in m rows and n columns implemented in a first layer;

a global DLL unit with n buffers and n clock signals;

a circular n-way multiplexer for circularly multiplexing n clock signals in the global DLL unit to average out phase variations;

a TDC matrix arranged in m rows and n columns implemented in a second layer below the first layer, wherein each TDC is arranged directly below a corresponding SPAD pixel, wherein the TDC is connected to the corresponding SPAD pixel through a hybrid bond; and an image signal processing unit for receiving image signals from a column TDC array.

* * * * *